Nov. 4, 1969 J. E. ZIDO 3,476,988

RESIN ENCAPSULATED SEMICONDUCTOR DEVICE

Filed Jan. 31, 1968

WITNESSES

Helen M. Farkas

James F. Young

INVENTOR

Joseph E. Zido

BY

C. L. Menzemer

ATTORNEY

United States Patent Office 3,476,988
Patented Nov. 4, 1969

3,476,988
RESIN ENCAPSULATED SEMICONDUCTOR DEVICE

Joseph E. Zido, Donora, Pa., assignor to Westinghouse Electric Corporation, Pittsburgh, Pa., a corporation of Pennsylvania Filed Jan. 31, 1968, Ser. No. 701,985
Int. Cl. H01l 3/00, 5/00
U.S. Cl. 317—234 4 Claims

ABSTRACT OF THE DISCLOSURE

This disclosure sets forth a resin encapsulated semiconductor device in which the encapsulating resin housing has a wall thickness and configuration that prevents fracturing of the resin along lead boundaries.

BACKGROUND OF THE INVENTION

This invention relates to a junction-type diode encapsulated and hermetically sealed within a body of a cured resin.

An object of the present invention is to provide a junction-type diode device comprising a wafer of semiconductor material which is encapsulated and hermetically sealed within and by a cured body of a resinous material and which does not have a layer or body of a cushioning material disposed about the wafer of semiconductor material, and in which the walls of the cured body of resinous material have a thickness and configuration that prevents fracturing of the resin along lead boundaries.

Other objects will, in part, appear hereinafter and will, in part, be obvious.

SUMMARY OF THE INVENTION

This invention provides a junction-type diode consisting of a wafer of semiconductor material, said wafer having substantially parallel top and bottom surfaces and side walls, a p-n junction disposed therein, a region of a first type of semiconductivity extending from said top surface to said p-n junction, a region of a second-type of semiconductivity extending from said bottom surface to said p-n junction, said p-n junction intersecting said side walls of said wafer, said side walls of said wafer being concaved inward toward the center of said wafer, metal electrical contacts affixed to the top and to the bottom surfaces of said wafer, an electrical lead affixed at one end to each of the metal electrical contacts, and a body of a cured resin disposed about and completely encapsulating said wafer, said contacts and a portion of said leads, the walls of said body of cured resin have a thickness at least equal to the diameter of the lead at and adjoining the point where the leads exit from the body.

DESCRIPTION OF THE PREFERRED EMBODIMENTS

Figure 1:
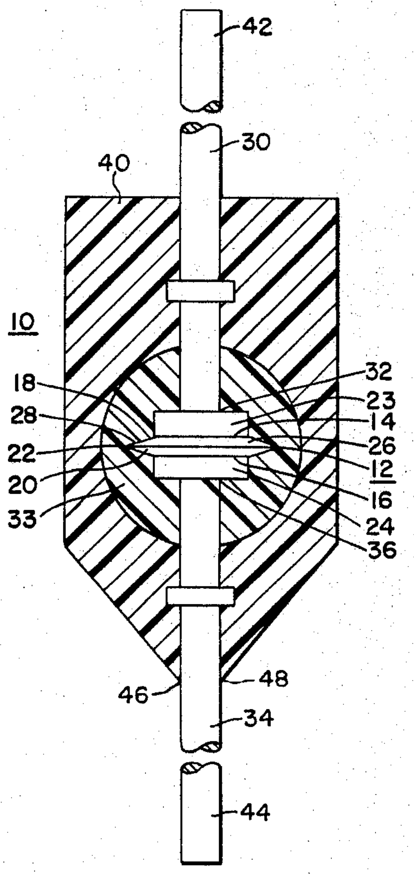
FIG. 1 PRIOR ART
FIGURE 1 is a sideview in cross-section of a prior art device.

With reference to FIG. 1, there is shown a semiconductor device 10 prepared in accordance with the prior art.

The device 10 consists of a wafer 12 of a semiconductor material as for example, silicon. The wafer 12 has a top surface 14 and a bottom surface 16. The wafer 12 has a region 18 of a first-type of semiconductivity and a region 20 of a second-type of semiconductivity. There is a p-n junction 22 disposed between regions 18 and 20.

The top surface 14 and the bottom surface 16 of the wafer 12 are substantially parallel.

A first metal electrical contact 23, as for example molybdenum, tantalum or tungsten, is affixed to top surface 14 of the wafer 12 and a second metal electrical contact 24 is affixed to bottom surface 16 of the wafer 12.

An electrical lead 30 is joined by soldering end 32 of the lead 30 to contact 23 and a second electrical lead 34 is joined to contact 24 by soldering end 36 of lead 34 to contact 24.

Sides 26 and 28 of the wafer 12 extend beyond the perimeter of the contacts and as a result of etching are thin and fragile at the extremities.

To prevent the extremities of the wafer 12 from cracking from the stresses which bear on the wafer during encapsulation a coating 38 of a cushioning material, for example a silicone resin is disposed entirely about the wafer 12 and the contacts 22 and 24.

The device is then disposed in a mold and a body 40 of an epoxy resin is disposed about the assembly and cured in place. It will be understood of course that ends 42 and 44 of leads 30 and 32 respectively extend beyond the cured body 40 to facilitate electrical electrical contact to the device.

The body 40 is comprised of an epoxy resin which is substantially impervious to moisture and exhibits little or no shrinkage when heated to a high temperature.

It will be noted that at points 46 and 48, where the end 44 of the lead 34 exits from the body 40, the cured epoxy coating tapers down to substantially a point contact with the lead 34.

This substantially point contact is a weak spot in the encapsulation and it is at this point that microfracturing of the epoxy often occurs due to thermal changes during operation of the device.

Once microfracturing begins, it becomes a progressive or continuing occurrence with the result that moisture is able to penetrate the device and render it unsatisfactory.

It has now been discovered that a device may be encapsulated in a body of epoxy resin without employing a cushioning material, and with the body having a wall thickness and configuration that prevents fracturing at the point where the lead exits from the body.

Figure 2:
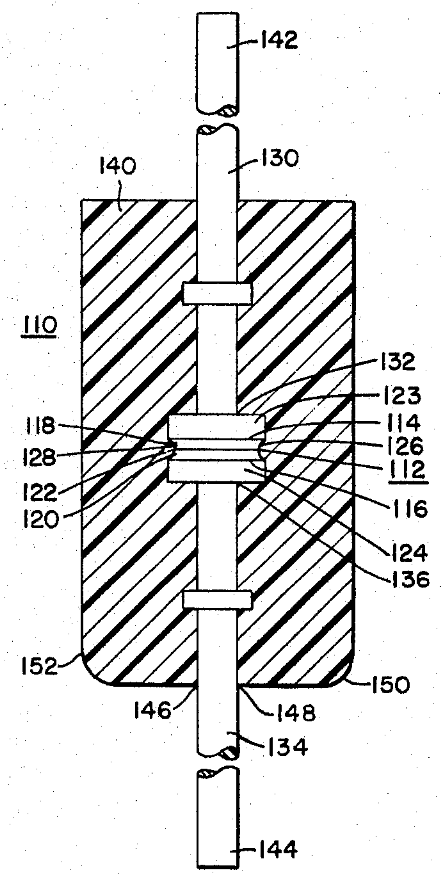
FIG. 2 is a sideview in cross-section of a resin encapsulated diode prepared in accordance with the teachings of this invention.

With reference to FIG. 2 there is shown a device 110 prepared in accordance with the teachings of this invention.

The device 110 consists only of a wafer 112 of a semiconductor material as for example silicon. The wafer 112 has a top surface 114 and a bottom surface 116. The surfaces 114 and 116 are substantially parallel.

The wafer 112 has a region 118 of a first-type of semiconductivity and a region 120 of a second-type of semiconductivity. There is a p-n junction 122 disposed between regions 118 and 120.

A first metal electrical contact 123 is affixed to the top surface 114 of the wafer 112 and a second metal electrical contact 124 is affixed to bottom surface 116 of the wafer 112. The metal contacts consist of a metal selected from the group consisting of molybdenum, tungsten, tantalum and base alloys thereof.

An electrical lead 130 is joined by soldering end 132 of the lead 130 to contact 123 and a second electrical lead 134 is joined to contact 124 by soldering end 136 of lead 134 to contact 124.

Sides 126 and 128 of the wafer 112 rather than extending beyond the perimeter of the contacts 123 and 124 as in the prior art, have been etched after the wafer 112 has been joined to the contacts 123 and 124 and the sides 126 and 128 of the wafer 112 are concave inward toward the center of the wafer.

By concaving the sides 126 and 128 inward the wafer 112 is less susceptible to stresses and thus can be encapsulated within a body 140 of a cured epoxy resin without employing any cushioning means as is required in prior art devices.

The epoxy resin employed to form the body 140 is substantially impervious to moisture and exhibits substantially no shrinkage when heated to high temperature. One suitable epoxy resin is that sold by Pacific Chemical and Resin under the designation EMC 90.

Ends 142 and 144 of leads 130 and 134 extend beyond the body 140 to facilitate making electrical contact to the device 110.

It will be noted that the body 140 is not tapered as in the prior art device and that at points 146 and 148, where end 144 of lead 134 exits from the body 140, the walls of the body 140 are thick and contact the lead 134 over a broad area.

It has been found that the danger of microfracturing is eliminated if the thickness of the walls of the body 140 are at least equal to the diameter of the lead at the point where the leads exit from the body.

If it is desired that there be some difference in the shape of the body 140 at the two ends thereof for orientation of the device the corners of the body at one end may be provided with a curved radius as at 150 and 152. The important feature is however, that the wall thickness be at least equal to the diameter of the leads and the thickness may exceed the lead diameter by up to several magnitudes.

While the invention has been described with reference to particular embodiments and examples it will be understood, of course, that modifications, substitutions and the like may be made without departing from its scope.

I claim as my invention:

1. A semiconductor device consisting of only:

(1) a wafer of semiconductor material, said wafer having substantially parallel top and bottom surfaces and side walls, a p-n junction disposed therein, a region of a first-type of semiconductivity extending from said top surface to said p-n junction, a region of a second-type of semiconductivity extending from said bottom surface to said p-n junction, the side walls of said wafer being concaved inward toward the center of said wafer, (2) metal electrical contacts affixed to the top and to the bottom surfaces of said wafer, (3) an electrical lead affixed at one end to each of the metal electrical contacts, and (4) a body of a cured resin disposed about and completely encapsulating said wafer, said contacts and a portion of said leads, the body of cured resin having a wall thickness at least equal to the diameter of the lead.

2. The device of claim 1 in which the other end of the electrical leads extend beyond the body of cured resin.

3. The device of claim 2 in which the body of cured resin is comprised of an epoxy resin and the thickness of the walls of the cured epoxy at the point where the leads exit from the body are equal to the diameter of the lead.

4. The device of claim 3 in which the electrical contacts consist of a metal selected from the group consisting of molybdenum, tungsten, tantalum and base alloys thereof.

References Cited

UNITED STATES PATENTS 3,237,272 3/1966 Kallander -------- 317—234 X

JOHN W. HUCKERT, Primary Examiner

U.S. Cl. XR.

317—235